(12) United States Patent
Huisinga et al.

(10) Patent No.: US 8,399,335 B2
(45) Date of Patent: Mar. 19, 2013

(54) SOPHISTICATED METALLIZATION SYSTEMS IN SEMICONDUCTORS FORMED BY REMOVING DAMAGED DIELECTRIC LAYERS AFTER FORMING THE METAL FEATURES

(75) Inventors: Torsten Huisinga, Dresden (DE); Michael Grillberger, Radebeul (DE); Frank Feustel, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 207 days.

(21) Appl. No.: 12/970,117

(22) Filed: Dec. 16, 2010

(65) Prior Publication Data
US 2012/0001343 A1 Jan. 5, 2012

(30) Foreign Application Priority Data
Jun. 30, 2010 (DE) .......................... 10 2010 030 757

(51) Int. Cl.
*H01L 21/76* (2006.01)
(52) U.S. Cl. ..................................... 438/421
(58) Field of Classification Search .................. 438/421; 257/750
See application file for complete search history.

(56) References Cited

U.S. PATENT DOCUMENTS

| 7,319,274 B2 * | 1/2008 | Beyer et al. ................... 257/774 |
| 7,868,455 B2 | 1/2011 | Chen ............................. 257/750 |
| 2006/0073695 A1 * | 4/2006 | Filippi et al. .................. 438/619 |
| 2007/0178713 A1 | 8/2007 | Jeng .............................. 438/787 |

OTHER PUBLICATIONS

Translation of Official Communication from German Patent Office for German Patent Application No. 10 2010 030 757.2 dated Feb. 18, 2011.

\* cited by examiner

*Primary Examiner* — Bradley K Smith
(74) *Attorney, Agent, or Firm* — Williams, Morgan & Amerson

(57) ABSTRACT

In sophisticated semiconductor devices, densely packed metal line layers may be formed on the basis of an ultra low-k dielectric material, wherein corresponding modified portions of increased dielectric constant may be removed in the presence of the metal lines, for instance, by means of a selective wet chemical etch process. Consequently, the metal lines may be provided with desired critical dimensions without having to take into consideration a change of the critical dimensions upon removing the modified material portion, as is the case in conventional strategies.

18 Claims, 6 Drawing Sheets

SOPHISTICATED METALLIZATION SYSTEMS IN SEMICONDUCTORS FORMED BY REMOVING DAMAGED DIELECTRIC LAYERS AFTER FORMING THE METAL FEATURES

BACKGROUND OF THE INVENTION

1. Field of the Invention

The present disclosure generally relates to the field of semiconductor devices, and, more particularly, to metallization systems including sensitive low-k dielectric materials and ultra low-k (ULK) dielectric materials.

2. Description of the Related Art

Today's global market forces manufacturers of mass products to offer high quality products at a low price. It is thus important to improve yield and process efficiency to minimize production costs. This holds especially true in the field of semiconductor fabrication, since here it is essential to combine cutting edge technology with volume production techniques. One important aspect in realizing the above strategy is seen in continuously improving device quality with respect to performance and reliability, while also enhancing the diversity of functions of semiconductor devices. These advances are typically associated with a reduction of the dimensions of the individual circuit elements, such as transistors and the like. Due to the continuous shrinkage of critical feature sizes, at least in some stages of the overall manufacturing process, frequently new materials may have to be introduced so as to adapt device characteristics to the reduced feature sizes. One prominent example in this respect is the fabrication of sophisticated metallization systems of semiconductor devices in which advanced metal materials, such as copper, copper alloys and the like, are increasingly used in combination with low-k dielectric materials which are to be understood as dielectric materials having a dielectric constant of approximately 3.0 and less, wherein, in most recent developments, materials have been used in which the effective dielectric constant may be even further reduced, for instance, by providing a porous structure, wherein these materials may also be referred to as ultra low-k (ULK) dielectrics. By using highly conductive metals, such as copper, the reduced cross-sectional area of metal lines and vias may at least be partially compensated for by the increased conductivity of copper compared to, for instance, aluminum, which has been the metal of choice over the last decades, even for sophisticated integrated devices.

On the other hand, the introduction of copper into semiconductor manufacturing strategies may be associated with a plurality of problems, such as sensitivity of exposed copper surfaces with respect to reactive components, such as oxygen, fluorine and the like, the increased diffusion activity of copper in a plurality of materials typically used in semi-conductor devices, such as silicon, silicon dioxide, a plurality of low-k dielectric materials and the like, copper's characteristic of generating substantially no volatile byproducts on the basis of typically used plasma enhanced etch processes and the like. For these reasons, sophisticated inlaid or damascene process techniques have been developed in which typically the dielectric material may have to be patterned first in order to create trenches and/or via openings, which may then be coated by an appropriate barrier material followed by the deposition of the copper material. Consequently, a plurality of highly complex processes, such as the deposition of sophisticated material stacks for forming the interlayer dielectric material including low-k dielectrics and ULK materials, patterning the dielectric material, providing appropriate barrier and seed materials, filling in the copper material, removing any excess material and the like, may be required for forming sophisticated metallization systems, wherein the mutual interactions of these processes may be difficult to assess, in particular, as material compositions and process strategies may frequently change in view of further enhancing overall performance of the semiconductor devices.

For example, the continuous shrinkage of the critical dimensions may also require reduced dimensions of metal lines and vias formed in the metallization system of sophisticated semiconductor devices which may lead to closely spaced metal lines, which in turn may result in increased RC (resistive capacitive) time constants. These parasitic RC time constants may result in significant signal propagation delay, thereby limiting overall performance of the semiconductor device, although highly scaled transistor elements may be used in the device level. For this reason, the parasitic RC time constants may be reduced by using highly conductive metals, such as copper, in combination with dielectric materials of reduced permittivity, also referred to as ULK materials, as previously discussed. On the other hand, these materials may exhibit significant reduced mechanical and chemical stability, for instance when exposed to the various reactive etch atmospheres, for instance during etch processes, resist removal and the like, thereby increasingly creating a damage zone at the exposed surface portions of these sensitive dielectric materials. The damaged surface portions, however, may result in reduced reliability of the overall metallization system, that is, a premature device failure may occur during operation of the device and/or subsequent process steps may be significantly affected by the damaged surface portions, thereby also contributing to a reduced overall performance and reliability. Moreover, the damaged zones of ULK materials may have a significantly increased dielectric constant compared to the initial material due to the modification caused by the etch processes. For these reasons, in some conventional process strategies, the damaged surface portions may be removed prior to subsequent process steps, which may also be associated with certain negative effects on the finally obtained semiconductor device, as will be described in more detail with reference to FIGS. 1a-1c.

FIG. 1a schematically illustrates a cross-sectional view of a semiconductor device 100 in an advanced manufacturing stage, i.e., in a manufacturing stage in which a metallization system 150 is to be formed on the basis of sensitive dielectric materials in combination with highly conductive metals. As illustrated, the semiconductor device 100 comprises a substrate 101, above which is formed a semiconductor layer 102, such as a silicon layer and the like, in and above which circuit elements 110 are typically provided, such as transistors, resistors, capacitors and the like. In sophisticated semiconductor devices, the circuit elements 110 may be formed on the basis of design rules requiring critical dimensions of 50 nm and significantly less, thereby enhancing performance of the individual circuit elements 110 and also providing a high packing density in and above the semiconductor layer 102. Consequently, an appropriate adaptation of the packing density in the metallization system 150 is required in order to appropriately connect the individual circuit elements 110 without consuming undue overall chip area and avoiding the necessity of providing a large number of individual metallization layers in the system 150. Typically, a plurality of metallization layers have to be implemented in the metallization system 150, wherein, for convenience, two adjacent metallization layers 120, 130 are illustrated in FIG. 1a. For example, the metallization layer 120 comprises an appropriate dielectric material 121, such as a low-k dielectric material, whose dielectric constant is 3.0 or significantly less. For example, as discussed above, in sophisticated cases, at least some of the metallization layers 120, 130 may comprise a ULK material having a dielectric constant of 2.7 or less, which is typically accomplished by providing a low-k dielectric base material and generating a porous structure in the dielectric base material, thereby further reducing the dielectric constant, however, thereby also reducing the mechanical and chemical resistivity of these sensitive materials, at least for specific reactive process atmospheres, which may typically have to be established upon forming the metallization system 150.

It should be appreciated that the dielectric constant of materials that are typically used in the metallization system 150 may be determined on the basis of well-established measurement procedures in which an appropriate material layer may be patterned into a capacitive structure having any desired configuration, wherein the material characteristics in terms of dielectric constant may then be determined by performing electrical measurement processes. In other cases, the material characteristics may be efficiently determined on the basis of sensitive analysis techniques, such as Fourier transformed infrared spectroscopy (FTIR), which is very sensitive to chemical modifications of materials and which may also allow a quantitative determination of materials within a material sample, wherein the material composition may then be efficiently correlated to a dielectric constant value, which may have been obtained by other measurement techniques. Consequently, the term low-k dielectric material may thus relate to a material having a dielectric constant of 3.0 and less based on well-established measurement techniques, wherein typically measurement results may vary by less than five percent. Similarly a ULK dielectric material may be considered throughout this application as a dielectric material having a dielectric constant of 2.8 and less, wherein typically the range of approximately five percent measurement tolerances have to be taken into consideration, depending on the measurement technique used for determining the dielectric constant. Furthermore, as discussed above, ULK materials may typically have a porous structure in which pores of dimensions of one to several nanometers may typically be randomly distributed across the entire material, wherein the material characteristics may nevertheless be considered as uniform, as long as a corresponding sample volume may be significantly greater than a corresponding "nano air gap" or pore, that is, as long as a plurality of nano pores may be provided within a sample volume. Furthermore, the metallization layer 120 may comprise a plurality of metal lines 122, which may provide the inner level electrical connection in the metallization layer 120. The metallization layer 120 may have a similar configuration as will be described with reference to the metallization layer 130. The metallization layer 130 may also comprise a low-k dielectric material 131 or a ULK material in the above-defined sense, in which a plurality of metal lines 132 are embedded. The metallization layer 130 may be considered as comprising a metal line layer 130B, the thickness of which may be substantially defined by the depth of the metal lines 132. Furthermore, a via layer 130A is typically provided so as to connect at least some of the metal lines 132 with some of the metal lines 122 of the lower lying metallization layer 120 at specific positions, as is, for instance, indicated by the dashed lines 132V. Consequently, the via layer 130A may be comprised of a portion of the dielectric material 131 in combination with one or more dielectric materials 133 having superior behavior with respect to chemical resistivity and mechanical stability. The layer 133 may also be considered as an etch stop layer and may be comprised of silicon nitride, nitrogen-containing silicon carbide, silicon dioxide or any appropriate combination of these materials in order to control the patterning process for forming corresponding openings of the vias 132V. Furthermore, in some cases, the etch stop layer 133 may also provide diffusion blocking abilities in order to avoid undue copper diffusion into sensitive device areas. To this end, typically, a significant amount of nitrogen may be incorporated in the layer 133.

The metal lines 132 may typically be comprised of a conductive barrier layer 132A or a layer system comprising two or more individual layers, while a highly conductive core metal or fill metal 132B may provide the desired superior conductivity of the metal lines 132 for a given cross-sectional area thereof. For example, copper or copper alloys may be provided for the metal 132B. Furthermore, as illustrated, the metal lines 132 may have to be provided in accordance with tightly set design rules in order to achieve the desired density of metal lines in the metallization layer 130. For example, as illustrated in FIG. 1a, a critical width 132W may be adjusted on the basis of design criteria, thereby also defining a pitch 132P, which may be of the same order of magnitude in densely packed device areas. For example, the dimensions 132W, 132P may be 100 nm and less in sophisticated semiconductor devices, depending on the metallization level considered.

As discussed above, the overall performance of the device 100 is strongly influenced by the performance of the metallization system 150, for instance in terms of signal propagation delay caused by parasitic RC time constants, which in turn are mainly affected by the parasitic capacitance of the metal line layers, such as the layer 130B. Consequently, it is extremely important to reduce the dielectric constant of the material 131 as much as possible, in particular in densely packed device areas, thereby requiring extremely low dielectric constant values for the material 131. Consequently, the presence of any modified material portions, as indicated by 131M, within the dielectric material 131 in the spaces between the closely spaced metal lines 132 may have a significant influence on the overall integrated dielectric constant and thus on the finally achieved electrical performance of the metallization system 150. In particular, very sensitive ULK materials may suffer from a significant material modification caused by exposure to reactive process atmospheres, thereby forming densified surface areas with a significantly increased dielectric constant, as is shown in FIG. 1a by the modified surface layers 131M which delineate at least the sidewalls of the metal lines 132.

Typically, the semiconductor device 100 as shown in FIG. 1a is formed on the basis of well-established process techniques which include the formation of the circuit elements 110 followed by an appropriate manufacturing sequence for providing a contact structure (not shown), which may act as an interface between the circuit elements 110 and the metallization system 150. Thereafter, the metallization system 150 may be formed by depositing an appropriate dielectric material, such as the materials 121 and 131 in combination with the etch stop layer 133. For convenience, corresponding manufacturing processes may be described with reference to the metallization layer 130, wherein it should be appreciated that similar process techniques may also be applied to the metallization layer 120 when requiring a similar configuration as the layer 130. Thus, after providing the metallization layer 120, the dielectric material 131 is deposited, for instance in the form of a silicon-containing material, which may exhibit a desired low dielectric constant which may be even further reduced on the basis of any appropriate treatments in order to form a porous structure and the like. In other cases, any other materials may be applied, for instance by spin-on techniques and the like, and any post-deposition treatments may be applied in order to further reduce the dielectric constant. At any rate, a wide class of ULK materials may suffer from a reduced mechanical and chemical resistivity in view of a plurality of plasma assisted etch recipes, cleaning processes and the like.

After providing the dielectric material 131 having the desired reduced dielectric constant, a complex patterning sequence is performed, for instance including the deposition of anti-reflective coating (ARC) materials in combination with resist materials so as to provide an appropriate etch mask in order to define the width 132W and the pitch 132P, as well as the lateral size and position of any vias 132V. The corresponding patterning sequence may represent a critical process sequence, since the lithography as well as the subsequent etch patterning strategies are designed so as to provide the smallest features sizes that may be consistently achieved in accordance with the specific design rules. Consequently, complex plasma assisted etch processes may have to be applied and subsequently any resist masks, hard mask materials and the like may have to be removed, thereby requiring performing a plurality of complex processes. Consequently, the material 131 within the resulting openings for the metal lines 132, and also for corresponding vias, may be repeatedly exposed to reactive atmospheres, which may result in a certain degree of damage, thereby forming the modified surface layer 131M. Due to the significantly different material characteristics of the modified layer 131M, the dielectric constant thereof may also be significantly increased, thereby, in total, increasing the parasitic time constants in the metal line layer 130B. Thereafter, the barrier material 132A may be formed, for instance, by well-established deposition techniques, followed by the deposition of the fill metal 132B, which may typically be accomplished on the basis of electrochemical deposition processes. Next, any excess material may be removed, for instance by chemical mechanical polishing (CMP), electro CMP, electro etching and the like, wherein also typically any modified portion of the dielectric material 131 may be removed from the top surface of the metallization layer 130.

Since the presence of the modified material 131M having the increased dielectric constant may result in reduced performance and thus increased power consumption of sophisticated semiconductor devices, such as complex microprocessors and the like, it has been proposed to remove the material 131M prior to forming the metal lines 132.

FIG. 1b schematically illustrates the semiconductor device 100 during a corresponding process strategy. As illustrated, trenches 134 are formed in the low-k dielectric material 131 on the basis of the critical width 132W, which may not be arbitrarily reduced due to the above-specified restrictions of the involved lithography and patterning processes. Thus, as illustrated, the modified material layer 131M may be formed within the openings 134, which may have significantly different material characteristics. Consequently, in some conventional approaches, the modified material layer 131M may be efficiently removed by using appropriate wet chemical etch recipes, as indicated by 103, which may exhibit a pronounced selectivity with respect to any non-modified portions of the dielectric material 131. For example, wet chemical chemistries based on HCL may be efficiently used for substantially selectively removing the modified portion 131M. For example, the layer 131M may have a thickness of approximately several nanometers to ten nanometers and more, which may thus be efficiently removed during the wet chemical etch process 103, without significantly affecting the non-modified portion 131, since the actual exposure time through the ambient 103 may be relatively short, while a moderately high degree of selectivity may also be observed.

FIG. 1c schematically illustrates the device 100 after the removal of the modified layer 131M, which, however, may result in an increase of the width of the trenches 134, as indicated by 134W. At the same time, the pitch 132P may be reduced, which may result in inferior process conditions upon filling the trenches of increased size 134 with the conductive materials. That is, the reduced pitch 132P may result in an increased probability of creating leakage paths between adjacent metal lines and/or the overall dielectric strength may be reduced, which may thus cause increased yield losses and reduced reliability of the metallization system 150. Thus, a corresponding shrinkage in the pitch 132P may have to be taken into consideration upon designing the semiconductor device 100, wherein, in combination with the increased width 134W, generally the resulting packing density in the metallization layer 130 has to be reduced.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides techniques and semiconductor devices in which metal lines may be formed in sensitive dielectric materials having a low dielectric constant, while substantially preserving desired critical dimensions without increasing the resulting dielectric constant, while in other cases the resulting dielectric constant may be even further reduced by providing air gaps laterally adjacent to the metal lines. To this end, at least a significant amount of any modified material portions, which may have been produced during the preceding patterning of the sensitive low-k dielectric material or ULK material may be efficiently removed in the presence of the metal lines, thereby forming corresponding gaps laterally adjacent to the metal lines. Thereafter, any appropriate dielectric material may be deposited prior to forming a next metallization layer. Consequently, complex metallization layers may be formed on the basis of tightly set design rules, wherein any mechanisms for modifying sensitive dielectric materials may not have to be taken into consideration since these portions of increased dielectric constant may be removed after the completion of the metal features. To this end, in some illustrative embodiments disclosed herein, appropriate wet chemical etch recipes may be applied, which may provide a certain degree of selectivity, thereby not unduly removing any non-modified portions of the sensitive dielectric material.

One illustrative method disclosed herein comprises forming an opening in an ultra low-k dielectric material formed in a metallization layer of a semiconductor device by performing a process sequence including at least one etch process that produces a modified material layer on at least some exposed surface areas within the opening. The method further comprises forming a conductive metal-containing material in the opening so as to form a metal region in the opening. Additionally, the method comprises removing the modified material layer from at least a portion of sidewalls of the opening in the presence of the metal region in order to form gaps adjacent to the metal region. Furthermore, the method comprises forming a dielectric material layer above the metallization layer so as to close the gaps.

A further illustrative method disclosed herein relates to forming a metal line in a metallization layer of a semiconductor device. The method comprises forming a trench in a dielectric material of the metallization layer and forming a modified material layer at least on sidewall areas of the trench. Additionally, the method comprises filling the trench that includes the modified material layer with a metal-containing material so as to form the metal line. Furthermore, at least a portion of the modified material layer is removed in the presence of the metal line so as to form a gap laterally adjacent to the metal line. Additionally, the method comprises forming a dielectric layer above the metal line and the gap.

One illustrative semiconductor device disclosed herein comprises a plurality of metal lines formed in an ultra low-k dielectric material of a metallization layer of the semiconductor device, wherein the ultra low-k dielectric material has a substantially uniform dielectric constant. Furthermore, the semiconductor device comprises an air gap formed laterally adjacent to each of the plurality of metal lines and laterally delimited by the ultra low-k dielectric material having the substantially uniform dielectric constant.

BRIEF DESCRIPTION OF THE DRAWINGS

The disclosure may be understood by reference to the following description taken in conjunction with the accompanying drawings, in which like reference numerals identify like elements, and in which.

Figure 1A:
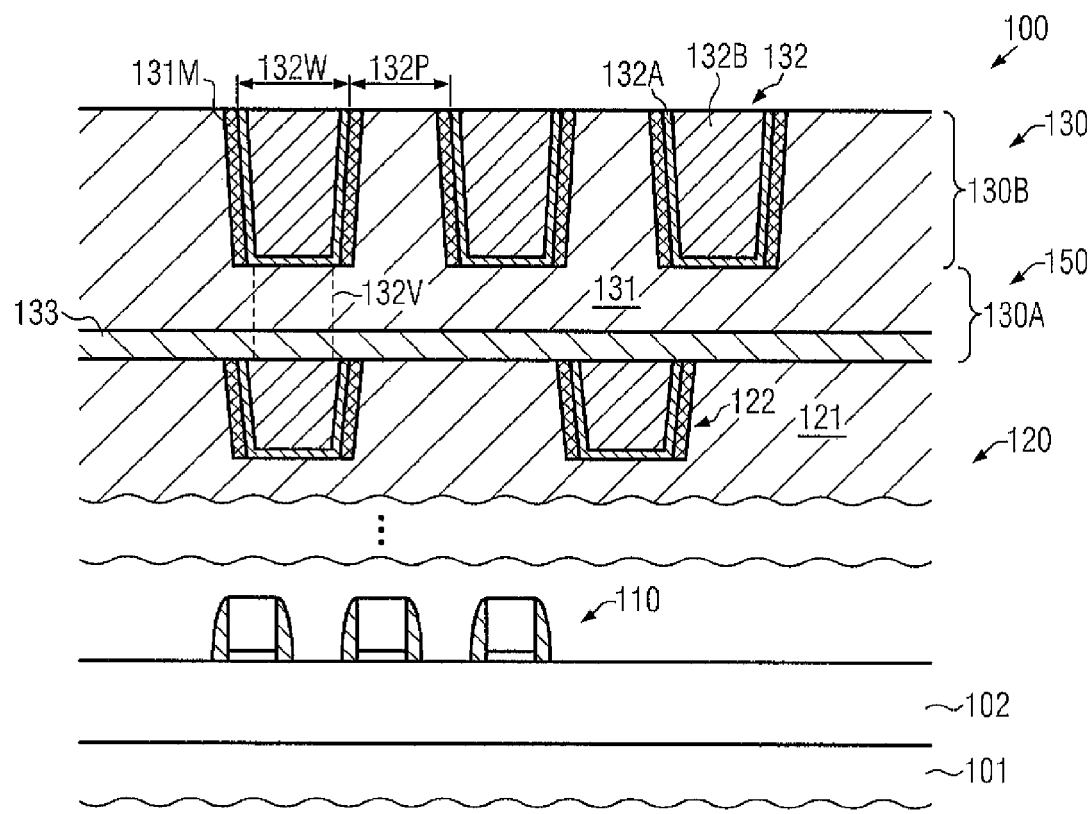
FIGS. 1a-1c schematically illustrate a sophisticated semiconductor device during various manufacturing stages in forming a complex metallization system on the basis of an ultra low-k dielectric material, according to conventional process strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which modified portions of an ultra low-k dielectric material may be removed without affecting the finally obtained critical dimensions of the metal lines in sophisticated metallization systems. That is, the metal line of a metallization layer under consideration may be formed on the basis of design rules that comply with the lithography and patterning capabilities of a corresponding metallization level without taking into consideration the generation of modified surface layers of a sensitive dielectric material upon patterning the ultra low-k dielectric material. Consequently, the metal-containing materials may be filled into the openings in the presence of the modified material layer, which may then be removed, for instance by using selective wet chemical etch recipes, thereby forming corresponding gaps laterally adjacent to the previously formed metal lines, wherein the gaps may have a width that is comparable with the thickness of the modified surface layer. Consequently, the respective gaps may be formed with a width of 50 nm and significantly less, depending on the initial thickness of the modified surface layers and may be subsequently refilled, at least partially, by any appropriate dielectric material, such as an ultra low-k dielectric material. Furthermore, substantially non-filled portions may be preserved from the initial gaps, thereby efficiently providing air gaps laterally adjacent to at least a portion of the metal lines, which may therefore result in an even further reduced integrated dielectric constant of the metal line layer. Consequently, critical metallization layers, i.e., the corresponding metal line layers thereof, may be provided with high packing density, while not negatively affecting the overall electrical performance, while in other cases even a reduced integrated dielectric constant may be achieved in the metal line layer compared to a dielectric constant that would be obtained on the basis of a uniform ultra low-k dielectric material.

Figure 1B:
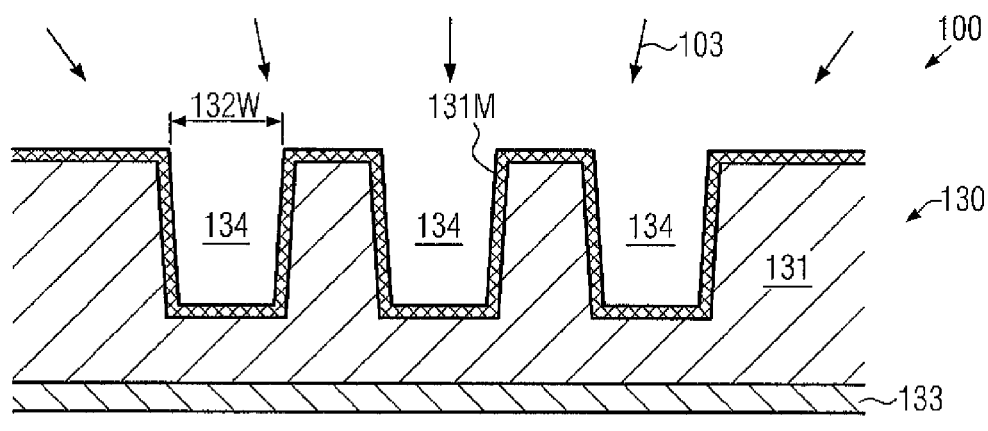
Figure 1C:
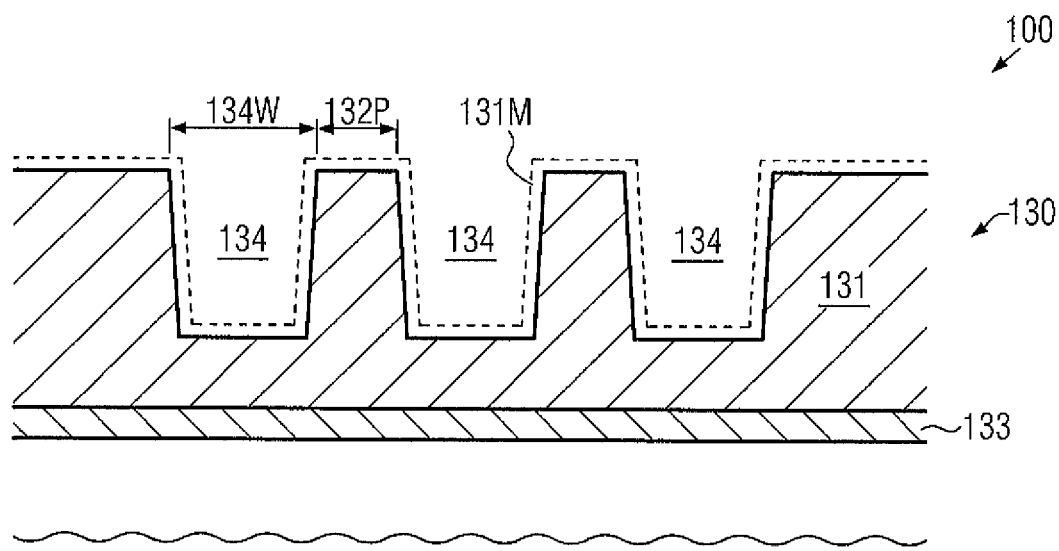

With reference to FIGS. 2a-2h, further illustrative embodiments will now be described in more detail, wherein reference may also be made to FIGS. 1a-1c, if appropriate.

Figure 2A:
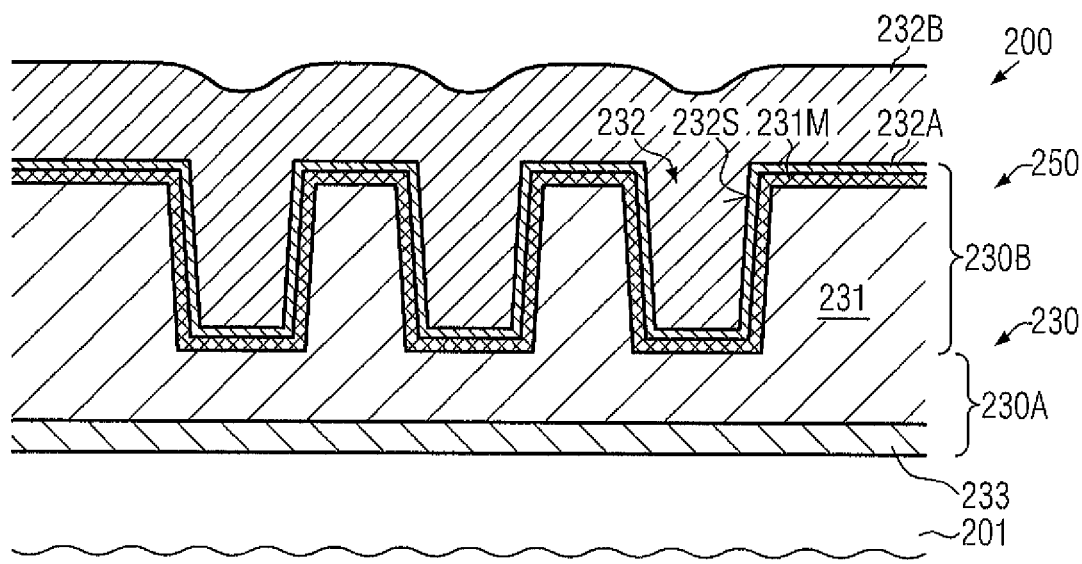
FIGS. 2a-2f schematically illustrate cross-sectional views of a semiconductor device during various manufacturing stages in forming a metallization layer on the basis of an ultra low-k dielectric material by reducing modified material portions after providing the metal lines, according to illustrative embodiments.

FIG. 2a schematically illustrates a cross-sectional view of a semiconductor device 200 in a manufacturing stage in which a metallization layer 230 of a metallization system 250 is to be formed on the basis of sophisticated device geometry in combination with sophisticated ultra low-k dielectric materials. The semiconductor device 200 may comprise a substrate 201, above which may be provided corresponding device levels, such as a semiconductor layer, a contact structure and the like. For example, circuit elements may be formed in and above a semiconductor layer, as is also previously discussed with reference to the semiconductor device 100. Furthermore, as indicated above, typically a plurality of metallization layers have to be provided in the metallization system 250, wherein, for convenience, a single metallization layer 230 is illustrated in FIG. 2a, wherein, however, it should be appreciated that any other critical metallization layer of the system 250 may be formed on the basis of the same principles as will be explained with reference to the metallization layer 230.

As illustrated, an etch stop layer 233, which may have any appropriate configuration, may be provided and may separate the metallization layer 230 from an underlying metallization layer (not shown). Furthermore, an ultra low-k dielectric material 231 may be formed above the etch stop layer 233, wherein, in the embodiment shown, a portion of the dielectric material 231 and the etch stop layer 233 may form or represent a via layer 230A, while a remaining portion of the dielectric material 231 may form a metal line layer 230B, together with metal lines 232. It should be appreciated, however, that the principles disclosed herein may also enclose embodiments in which a different type of dielectric material may be provided within the via layer 230A, for instance with respect to enhancing overall mechanical stability and the like. In this respect, it is to be noted that the overall electrical performance of the metallization layer 230 may be substantially determined by the parasitic time constant in the metal line layer 230B.

Furthermore, with respect to any material characteristics of the ultra low-k material 231, the same criteria may apply as previously explained with reference to the semiconductor device 100. The metal lines 232 may have any appropriate dimensions in accordance with sophisticated design rules, as is, for instance, also discussed above with reference to the semiconductor device 100. For example, a width of the metal lines 232 may be 100 nm and less and similarly a spacing between the metal lines 232 may be in the above-specified order of magnitude. It should be appreciated, however, that any other appropriate critical dimensions may be applied as required by the overall design rules. Furthermore, a modified material layer 231M is typically present, at least at sidewalls 232S of the metal line, which may thus have a significantly increased dielectric constant due to the significant degree of material modification, as is also discussed above. For example, the layer 231M may have a thickness, for instance at the sidewalls 232S, of several nanometers to ten or more nanometers, wherein, in some illustrative embodiments, as will be described later on in more detail, the thickness of the layer 231M may be intentionally increased by applying at least one additional modification step. Furthermore, as illustrated, the metal lines 232 may be formed on the basis of one or more conductive barrier materials 232A and a highly conductive fill material 232B, wherein well-established material systems, such as tantalum nitride, tantalum, titanium nitride and the like, in combination with copper, copper alloys, silver and the like, may be used. In the manufacturing stage shown, the materials 232A, 232B may be provided with sufficient excess portions in order to reliably fill openings of the metal lines 232.

The semiconductor device 200 as illustrated in FIG. 2a may be formed on the basis of any appropriate process strategy as is also, for instance, discussed above with reference to the semiconductor device 100. It should be appreciated, however, that the metal lines 232 may be formed on the basis of the desired critical dimensions, as is, for instance, discussed above with reference to FIG. 1a, without having to take into consideration the thickness of the modified layer 231M.

Figure 2B:
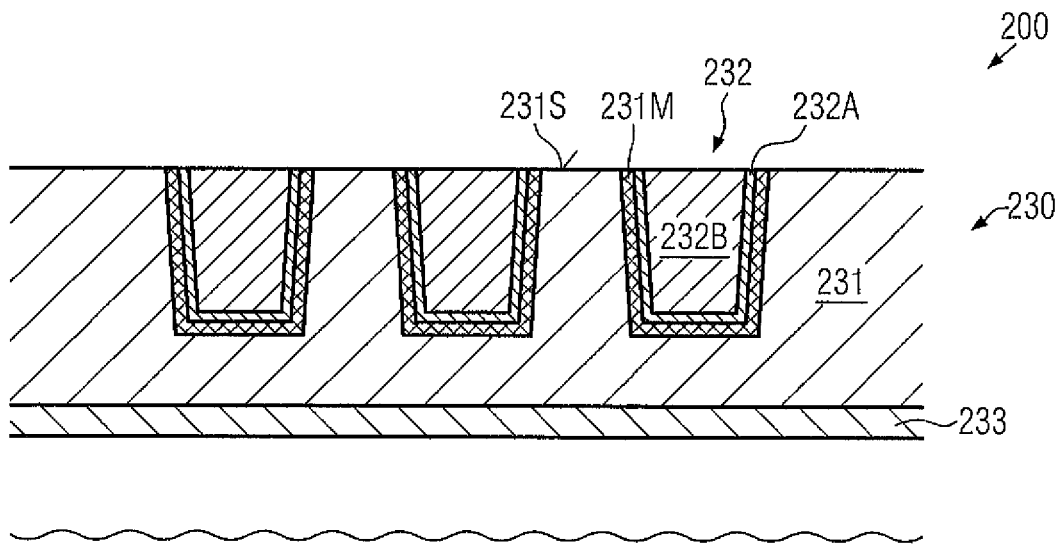

FIG. 2b schematically illustrates the device 200 in a further advanced manufacturing stage. As illustrated, any excess portion of the materials 232A, 232B (FIG. 2a) may be removed, which may be accomplished on the basis of CMP, electro CMP, etching and the like, thereby also planarizing the overall surface topography in order to provide a substantially planar surface 231S. During the corresponding removal process, a modified portion of the material 231 formed on horizontal device areas may also be removed. In other cases, generally a thin layer of superior etch resistivity and mechanical stability may be provided on top of the material 231, which may thus reduce the degree of surface modification or may avoid any surface modification at the surface 231S and which may also act as a stop layer or control layer upon removing any excess portions of the materials 232A, 232B. Thereafter, if required, the modified portions 231M may be exposed if a corresponding top surface of superior stability and/or chemical resistivity has been provided in an earlier manufacturing stage. In other cases, the portion 231M may be exposed upon removing excess portions of the materials 232A, 232B.

Figure 2C:
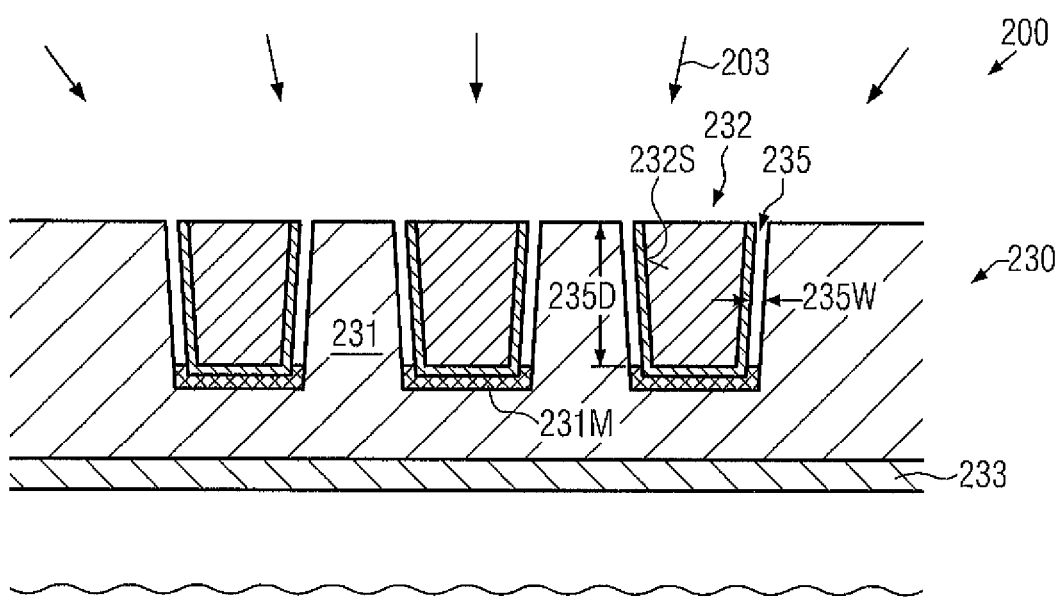

FIG. 2c schematically illustrates the device 200 in a further advanced manufacturing stage in which a removal process 203 may be applied so as to selectively remove at least a portion of the modified material 231M. To this end, in some illustrative embodiments, wet chemical etch recipes, for instance based on HCl, may be applied, which may exhibit a significantly greater etch rate compared to the non-modified portion of the material 231 and also with respect to the metal lines 232. Appropriate process parameters for the process 203 may be readily determined by experiments in order to adjust selectivity based on temperature, concentration of HCl and the like for a given material composition of the ultra low-k material 231 and the type of modification caused therein. As will be described later on in more detail, the selectivity of the process 203 may also be adjusted by influencing the type and degree of modification by applying a specifically designed process step for establishing a reactive process atmosphere so as to intentionally induce a certain degree and type of modification. Consequently, depending on the degree of selectivity, corresponding gaps 235 may be formed laterally adjacent to the metal lines 232 and may have a width 235W and a depth 235D which may be adjusted on the basis of the process parameters of the process 203, wherein at least the width 235W may also depend on a thickness of the modified material 231M at the sidewalls 232S. It should be appreciated that the depth 235D may be adjusted such that a significant amount of the material at the sidewalls 232S is removed, while nevertheless avoiding a significant degree of under etching of the metal lines 232, if considered inappropriate, for instance with respect to overall mechanical stability and the like. To this end, the process 203 may be controlled with respect to etch time in order to provide the gaps 235 with a desired depth.

Figure 2D:
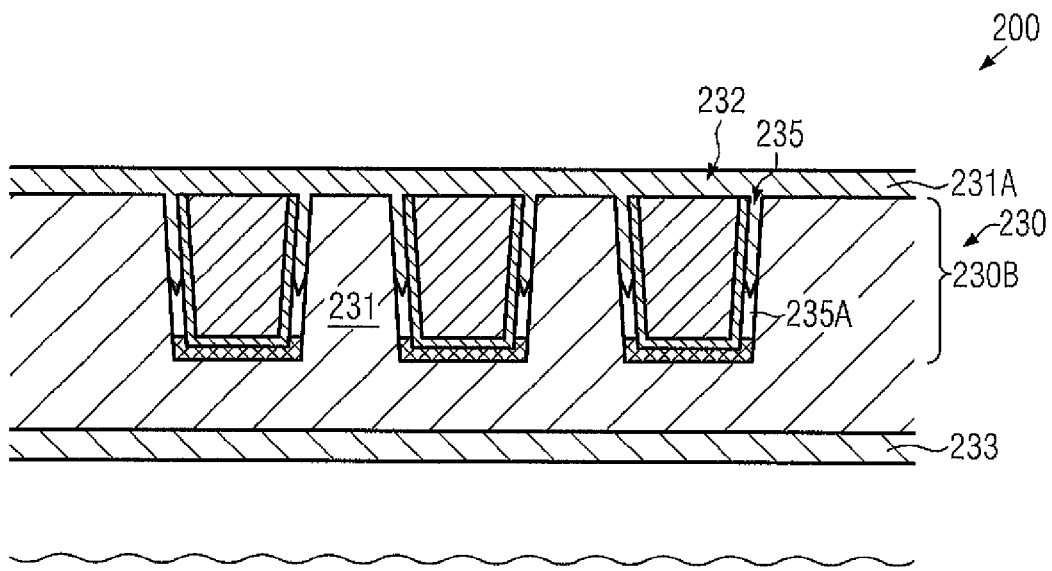

FIG. 2*d* schematically illustrates the semiconductor device 200 in a further advanced manufacturing stage. As shown, a dielectric material 231A may be formed above the metal lines 232 and above the gaps 235, thereby reliably closing the gaps 235. In the embodiment shown, the material 231A may be provided in the form of an ultra low-k dielectric material which may have basically the same material configuration as the material 231 so that a substantially uniform dielectric constant may be achieved in the metallization layer 230 laterally adjacent to the metal lines 232. That is, the material 231A may be deposited and possibly treated to adjust the material characteristics and the dielectric constant so as to obtain a desired low value, which may be equal to the dielectric constant of the material 231, wherein the term equal should include corresponding variations in the dielectric constant of ± ten percent with respect to the value of the material 231. Consequently, an integrated low dielectric constant may be accomplished in the vicinity of the metal lines 232 due to substantially uniform behavior of the dielectric constant of the materials 231, 231A. Furthermore, in some illustrative embodiments, as illustrated in FIG. 2*d*, the deposition parameters may be selected such that the gaps 235 may not be completely filled with the material 231A so that non-filled areas, indicated by 235A, may be preserved within the gaps 235, thereby even further reducing the integrated dielectric constant in the metal line layer 230B. Thus, with respect to the dielectric behavior, the non-filled portions 235A may be considered as air gaps, the size of which may be adjusted on the basis of the controlling of the deposition parameters for providing the material 231A. That is, upon using process parameters which may result in a pronounced generation of any overhangs at the top of the gaps 235, an early closure of the gaps 235 may be accomplished, thereby providing an increased interior volume, which may remain non-filled.

Figure 2E:
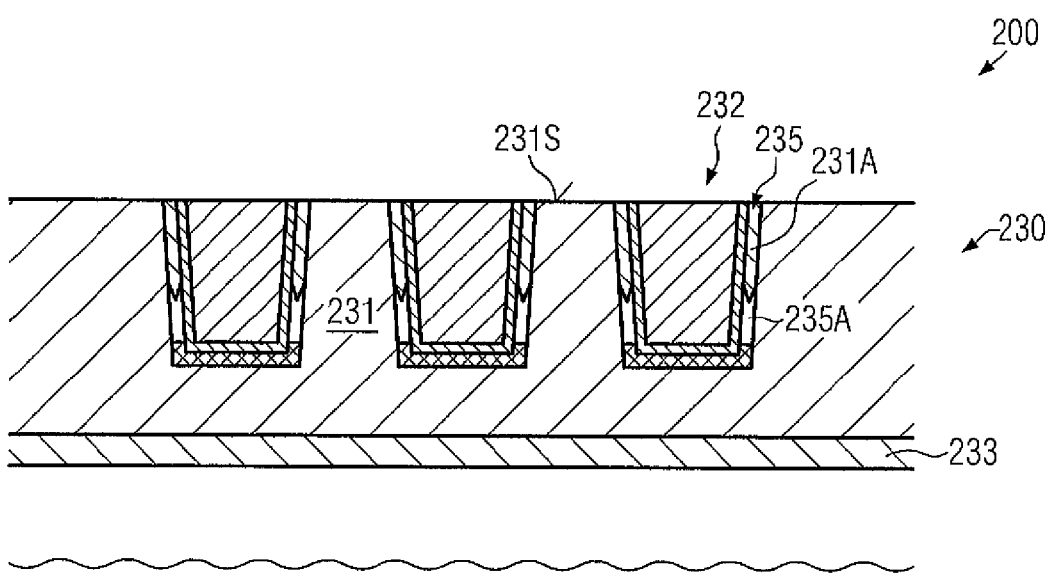

FIG. 2*e* schematically illustrates the semiconductor device 200 after the removal of any excess portion of the material 231A in order to provide the planar surface topography 231S. To this end, CMP, etch processes and the like may be applied, wherein preferably any removal process may be applied, which may avoid undue modification of the materials 231, 231A. For example, wet chemical etch recipes, CMP and the like may be efficiently applied.

Figure 2F:
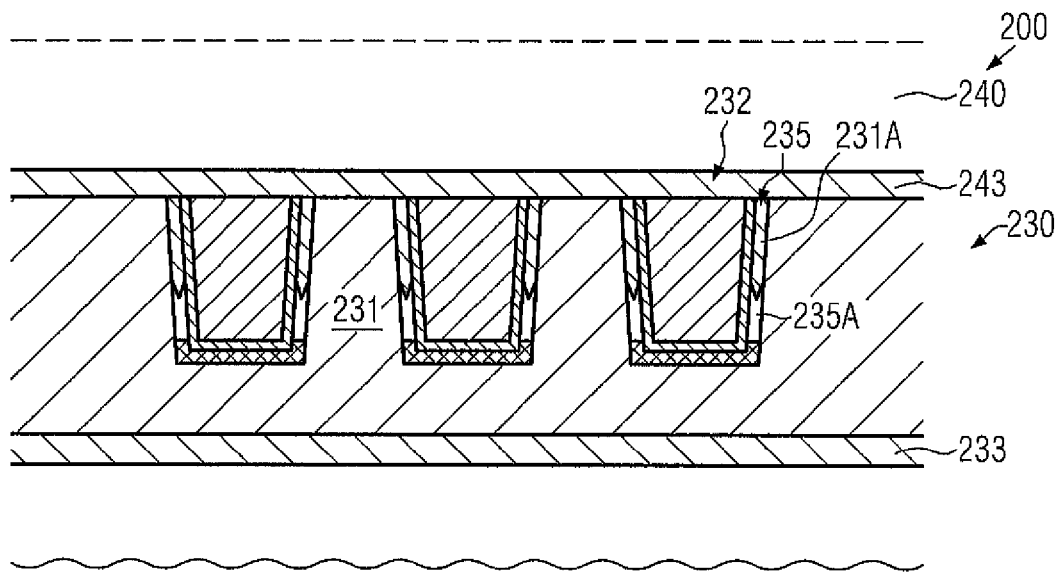

FIG. 2*f* schematically illustrates the device 200 in a further advanced manufacturing stage. As shown, an etch stop layer 243 of a subsequent metallization layer 240 may be formed on the metallization layer 230, i.e., on the metal lines 232 and the dielectric material 231 and the material 231A. The etch stop material 243 may be provided in the form of any appropriate material, as is also previously discussed with reference to the layer 233 and the layer 133 of the semiconductor device 100. Thereafter, the further processing may be continued by depositing a further dielectric material, such as an ultra low-k dielectric material and patterning the same, as discussed with reference to the semiconductor device 100 and the layer 230. Furthermore, if required, a modified material in the metallization layer 240 may also be removed, as is described in the context of the metallization layer 230.

Figure 2G:
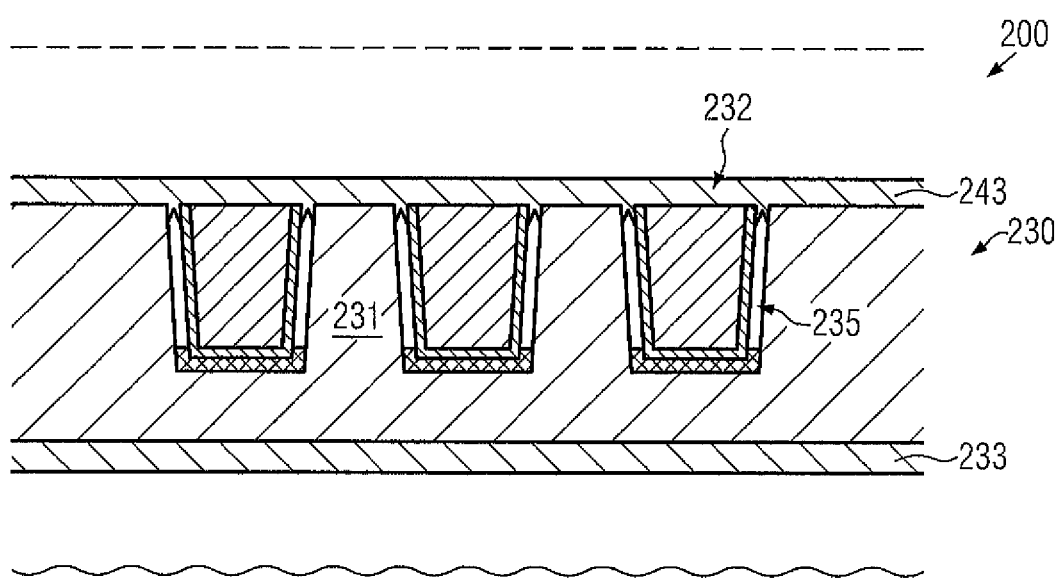
FIG. 2g schematically illustrates the semiconductor device according to a further illustrative embodiment in which air gaps obtained by selectively removing modified portions of the ultra low-k dielectric material may be closed on the basis of an etch stop material of a subsequent metallization layer.

FIG. 2*g* schematically illustrates the semiconductor device 200 according to further illustrative embodiments in which the gaps 235 may be closed upon providing material for the etch stop layer 243. To this end, deposition parameters may be selected such that the gaps 235 may be closed in an early manufacturing stage in order to preserve the desired overall dielectric constant since typically the etch stop material 243 may have a significantly higher dielectric constant compared to the ultra low-k dielectric material 231. Depending on the resulting surface topography upon depositing the material of the layer 243, a further planarization step may be applied, for instance in the form of a CMP process, in order to reduce any surface topography, which may be caused due to the presence of the gaps 235. Thereafter, the processing may be continued by process strategies as described above. Consequently, in these illustrative embodiments, any additional deposition steps may be avoided since the material for the etch stop layer 243 may be concurrently used for efficiently closing the gaps 235.

Figure 2H:
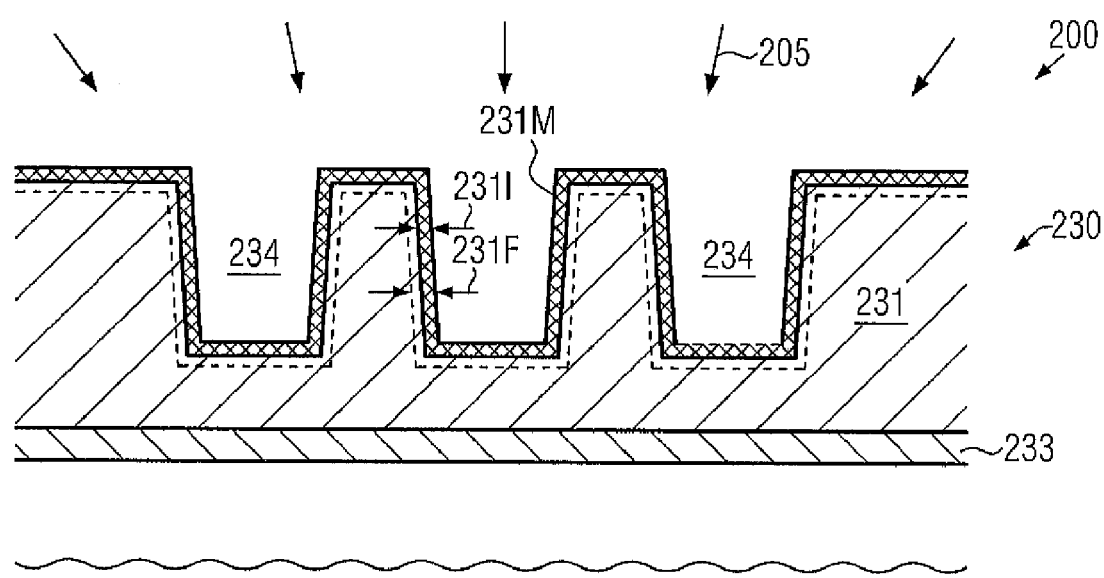
FIG. 2h schematically illustrates a cross-sectional view of the semiconductor device according to further illustrative embodiments wherein at least one additional process step may be applied upon forming trenches for the metal lines in the ultra low-k dielectric material in order to appropriately control a thickness of modified surface layers therein.

FIG. 2*h* schematically illustrates the semiconductor device 200 according to further illustrative embodiments in which superior control upon defining the size and/or the material characteristics of the modified material layer 231M may be achieved. As illustrated, trenches 234 may be provided in the ultra low-k material 231, wherein the trenches 234 may be formed on the basis of the desired critical dimensions, as is also previously discussed. Furthermore, as explained above, the patterning sequence may result in a certain degree of surface modification, as indicated by the layer 231M. In the embodiment shown, an additional process step 205 may be applied in which the degree of modification, for instance in terms of the degree of changing the material characteristics and/or in terms of increasing a width of the modified portion 231M, may be controlled. To this end, any appropriate reactive etch atmosphere may be established in order to further increase the thickness of the material layer 231M from an initial thickness 231I, as may be caused during the preceding patterning sequence, to a final thickness 231F so as to provide an increased width of the corresponding gaps that may be formed upon removing the modified material 231M, as is also described above. To this end, substantially isotropic plasma atmospheres, for instance on the basis of oxygen plasma, possibly in combination with any reactive components, such as fluorine and the like, may be established, while in other cases corresponding wet chemical cleaning recipes may be applied for a well-defined process time for given process parameters. In addition or alternatively to modifying the resulting thickness, the degree of material modification may be adjusted, for instance by incorporating certain species, for instance based on plasma treatment and the like, thereby establishing a more pronounced difference between the modified portion 231M and the initially applied ultra low-k dielectric material 231, which may result in a desired high degree of selectivity upon removing the modified portion 231M on the basis of a selective etch process.

Consequently, by applying the additional step 205, the material characteristics and/or the layer thickness of the modified portion 231M may be adjusted in a highly controllable manner, thereby also providing superior process control upon removing the modified portion 231M, for instance for adjusting the finally achieved width of the corresponding gaps and the like. That is, after performing the process 205, further processing may be continued by refilling the trenches 234, as discussed above, and subsequently removing the modified portion 231M in order to obtain the gaps with superior process uniformity.

As a result, the present disclosure provides semiconductor devices and manufacturing techniques in which a modified or damaged material portion of ultra low-k dielectric materials may be efficiently removed in the presence of the metal lines, thereby forming corresponding gaps laterally adjacent to the metal lines. To this end, a selective etch process may be applied. The gaps may be closed, for instance, on the basis of an ultra low-k dielectric material or an etch stop material of a subsequent metallization layer. By controlling the degree of filling the gaps, the size of any non-filled portions and thus air gaps may be adjusted. Consequently, densely packed metal line layers may be formed on the basis of desired critical dimensions without increasing the parasitic time constants or even reducing the total dielectric constant of the metal line layer by providing corresponding air gaps.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an opening in an ultra low-k dielectric material formed in a metallization layer of a semiconductor device by performing a process sequence including at least one etch process that produces a modified material layer on at least some exposed surface areas within said opening, the modified material layer having a first thickness;
    increasing the thickness of the modified material layer to a second thickness;
    forming a conductive metal-containing material in said opening so as to form a metal region in said opening;
    removing said modified material layer from at least a portion of sidewalls of said opening in the presence of said metal region so as to form gaps adjacent to said metal region, the gaps having approximately the second thickness; and
    forming a dielectric material layer above said metallization layer so as to close said gaps.

2. The method of claim 1, wherein forming said dielectric material layer comprises forming a low-k dielectric material in a portion of said gaps.

3. The method of claim 2, further comprising removing an excess portion of said low-k dielectric material from above said metallization layer and forming a dielectric etch stop layer above said metallization layer.

4. The method of claim 1, wherein forming said dielectric layer comprises forming a dielectric etch stop layer above said metallization layer.

5. The method of claim 1, wherein removing said modified material layer comprises performing a selective etch process in which a removal rate of material of said modified material layer is greater than a removal rate of a substantially non-modified portion of said ultra low-k dielectric material.

6. The method of claim 5, wherein said selective etch process comprises a selective wet chemical etch process.

7. The method of claim 1, wherein forming said conductive metal-containing material in said opening comprises forming a conductive barrier layer on said modified material layer and forming a fill metal on said conductive barrier layer.

8. The method of claim 1, wherein said metal region is a metal line of said metallization layer.

9. The method of claim 8, wherein a critical width of said metal line is approximately 100 nm or less.

10. A method of forming a metal line in a metallization layer of a semiconductor device, the method comprising:
    forming a trench in a dielectric material of said metallization layer;
    forming a modified material layer at least on sidewall areas of said trench, the modified material layer having a first thickness;
    increasing the thickness of the modified material layer to a second thickness;
    filling said trench including said modified material layer with a metal-containing material so as to form said metal line;
    removing at least a portion of said modified material layer in the presence of said metal line so as to form a gap laterally adjacent to said metal line, the gap having approximately the second thickness; and
    forming a dielectric layer above said metal line and said gap.

11. The method of claim 10, wherein forming said modified material layer comprises performing a process sequence to form said trench and initiating a material modification during said process sequence.

12. The method of claim 10, wherein increasing the thickness of said modified material layer comprises performing at least one process step on the basis of a reactive process atmosphere so as to increase the thickness of said modified material layer to the second thickness.

13. The method of claim 10, wherein forming said dielectric layer above said metal line and said gap comprises forming a low-k dielectric material having a dielectric constant of 3.0 or less.

14. The method of claim 13, wherein forming said low-k dielectric material comprises partially filling said gap so as to provide an air gap laterally adjacent to a portion of said metal line.

15. The method of claim 13, further comprising forming a dielectric etch stop layer of a next metallization layer above said low-k dielectric material.

16. The method of claim 10, wherein forming said dielectric layer above said metal line and said gap comprises forming a dielectric etch stop layer on said metal line and above said gap so as to close said gap and form an air gap.

17. The method of claim 10, wherein removing at least a portion of said modified material layer comprises performing a selective wet chemical etch process.

18. The method of claim 17, wherein said selective wet chemical etch process is performed by using HCl.

* * * * *